(12) United States Patent
Chen et al.

(10) Patent No.: US 11,876,089 B2
(45) Date of Patent: Jan. 16, 2024

(54) ELECTROSTATIC DISCHARGE (ESD) PROTECTION FOR CMOS CIRCUITS

(71) Applicant: Synaptics Incorporated, San Jose, CA (US)

(72) Inventors: Shih-Fan Chen, Hsinchu (TW); Abhijat Goyal, Lakeway, TX (US)

(73) Assignee: Synaptics Incorporated, San Jose, CA (US)

( * ) Notice: Subject to any disclaimer, the term of this patent is extended or adjusted under 35 U.S.C. 154(b) by 271 days.

(21) Appl. No.: 17/175,168

(22) Filed: Feb. 12, 2021

(65) Prior Publication Data

US 2021/0257353 A1      Aug. 19, 2021

Related U.S. Application Data

(60) Provisional application No. 62/976,635, filed on Feb. 14, 2020.

(51) Int. Cl.
*H01L 27/02* (2006.01)
*H02H 9/04* (2006.01)

(52) U.S. Cl.
CPC ......... *H01L 27/0285* (2013.01); *H02H 9/046* (2013.01)

(58) Field of Classification Search
CPC .................... H01L 27/0285; H02H 9/046
See application file for complete search history.

(56) References Cited

U.S. PATENT DOCUMENTS

| | | | |
|---|---|---|---|
| 2006/0274466 A1* | 12/2006 | Rice | H01L 27/0266 361/56 |
| 2008/0049365 A1* | 2/2008 | Worley | H01L 27/0285 361/56 |

\* cited by examiner

*Primary Examiner* — Benjamin Tzu-Hung Liu
(74) *Attorney, Agent, or Firm* — Paradice & Li LLP

(57) ABSTRACT

A voltage clamp is disclosed. The voltage clamp may include a plurality of transistors to limit the voltage between a power supply and ground. In addition, the voltage clamp may include a positive feedback signal to reduce turn-on time of the plurality of transistors.

13 Claims, 3 Drawing Sheets

ELECTROSTATIC DISCHARGE (ESD) PROTECTION FOR CMOS CIRCUITS

CROSS-REFERENCE TO RELATED APPLICATION

This application claims the benefit of U.S. Provisional Patent Application No. 62/976,635 entitled "ELECTROSTATIC DISCHARGE (ESD) PROTECTION FOR CMOS CIRCUITS" filed on Feb. 14, 2020, the entirety of which is hereby incorporated by reference.

TECHNICAL FIELD

The present embodiments relate generally to complementary metal-oxide-semiconductor (CMOS) circuits, and more specifically to electrostatic discharge (ESD) protection for CMOS circuits.

BACKGROUND OF RELATED ART

Electronic circuits may include N-type metal-oxide-semiconductor (NMOS) and P-type metal-oxide-semiconductor (PMOS) transistors that operate within, and/or withstand exposure to, a limited range of voltages. For example, some electronic circuit designs may transmit, receive, and process electrical signals within a 1.8 volt range while some other circuit designs may operate with electrical signals within a 3.3 volt range. The design of the NMOS and PMOS transistors collectively referred to as complementary metal-oxide-semiconductor (CMOS) transistors may have design features (oxide thickness, gate dimensions, doping concentrations, and the like) that determine their operating voltage.

In some cases, an electronic circuit may be exposed to a high voltage that can damage some of the circuit components. For example, an electrostatic discharge (ESD) event may expose an electronic circuit to a very high voltage (sometimes thousands of volts) for a relatively short time period (often in the range of nano-seconds). Since the circuit components may be designed to operate within a lower voltage range, the circuit components may be damaged by ESD events. In some cases, ESD voltages may cause PN junction failures or oxide failures to CMOS transistors. Furthermore, as device geometries of the transistors shrink, the transistors become more susceptible to damage with lower ESD voltages. For example, a rapture voltage (e.g., voltage needed to damage a PN junction) associated with a CMOS transistor may decrease as device geometries become smaller.

ESD protection circuits may prevent ESD damage by limiting or "clamping" voltage that are applied to electronic circuits. In some cases, the implementation ESD protection circuits may require substantial area and/or specialized devices. The area requirements and specialized devices may increase the cost and complexity of an associated integrated circuit. Thus, there is a need for a simple and low-cost ESD protection circuit for use with electronic circuits.

BRIEF DESCRIPTION OF THE DRAWINGS

The exemplary embodiments are illustrated by way of example and are not intended to be limited by the figures of the accompanying drawings. Like numbers reference like elements throughout the drawings and specification.

SUMMARY

Figure 1:
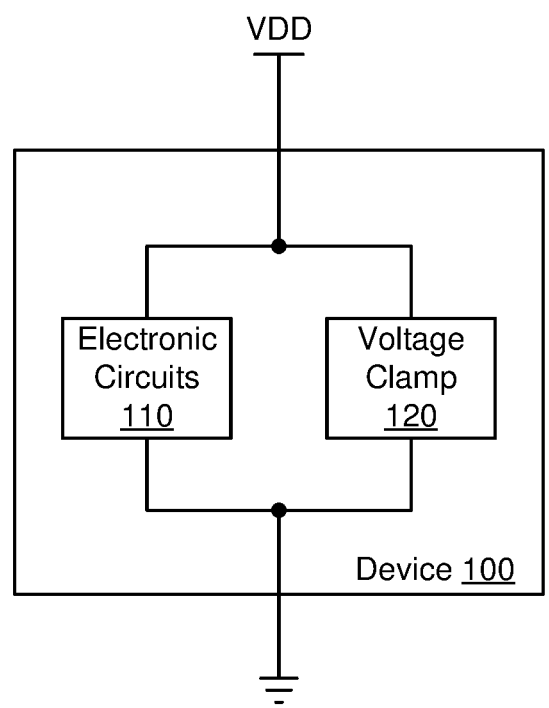
FIG. 1 shows a block diagram of a complementary metal-oxide-semiconductor (CMOS) device, in accordance with some implementations.

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A voltage clamp is disclosed. The voltage clamp may include a first transistor, a second transistor, a third transistor, and a first inverter. The first transistor may have a drain coupled to a power supply. The second transistor may have a drain coupled to a source of the first transistor and a source coupled to ground. The third transistor may be configured to produce a positive feedback signal based on a first voltage at a gate of the second transistor. The first inverter may be configured to control an operation of the first transistor based at least in part on the positive feedback signal so that the first transistor and the second transistor provide a discharge path between the power supply and ground.

An integrated circuit is disclosed. The integrated circuit may include electronic circuitry and a voltage clamp. The voltage clamp may include a first transistor, a second transistor, a third transistor, and a first inverter. The first transistor may have a drain coupled to a power supply. The second transistor may have a drain coupled to a source of the first transistor and a source coupled to ground. The third transistor may be configured to produce a positive feedback signal based on a first voltage at a gate of the second transistor. The first inverter may be configured to control an operation of the first transistor based at least in part on the positive feedback signal so that the first transistor and the second transistor provide a discharge path between the power supply and ground.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the exemplary embodiments. However, it will be apparent to one skilled in the art that these specific details may not be required to practice the exemplary embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The exemplary embodiments are not to be construed as limited to specific examples described herein but rather to include within their scope all embodiments defined by the appended claims.

Electronic circuits risk damage when exposed to high voltages such those associated with electrostatic discharge (ESD) events. ESD voltages may have a voltage potential of thousands of volts and can permanently destroy circuit components. Traditional ESD protection devices are larger than other circuit components, adding cost and complexity to the electronic circuit.

Implementations of the subject matter described in this disclosure may include a voltage clamp that provides protection to electronic circuits from exposure to high voltages, such as voltages associated with ESD events. The voltage clamp may include stacked transistors to limit the voltage between an electronic circuit's power supply and ground. Additionally, the voltage clamp may include a positive feedback loop to reduce the turn on time of one or more of the stacked transistors.

FIG. 1 shows a block diagram of a complementary metal-oxide-semiconductor (CMOS) device 100, in accordance with some implementations. The device 100 may include electronic circuits 110 and a voltage clamp 120. In some implementations, the device 100 may be an integrated circuit, a system-on-a-chip (SoC), a processor, a memory, or any other feasible electronic device or circuit. The electronic circuits 110 and the voltage clamp 120 (sometimes referred to as a power supply clamp) may include a number of components including N-type metal-oxide-semiconductor (NMOS) transistors, P-type metal-oxide-semiconductor (PMOS) transistors (bipolar junction transistors (BJTs), capacitors, resistors, diodes, inductors, and the like.

In some embodiments, the electronic circuits 110 may include components arranged to perform any feasible analog and/or digital processing function such as numeric and/or procedural processing functions, to implement memories such as dynamic and/or static memories, and/or to transmit and receive communication signals including single-ended, differential, and/or wireless communication signals. The electronic circuits 110 may be powered by, and coupled to, a power supply (shown as VDD) and also may be coupled to ground.

The voltage clamp 120 may be coupled between the power supply and ground. In some implementations, the voltage clamp 120 may prevent damage to the device 100 caused by transient overvoltage events including, for example, electrostatic discharge (ESD) events. The voltage clamp 120 may limit or "clamp" the magnitude of a voltage that can be delivered to the electronic circuits 110. In this manner, transistors and other components within the electronic circuits 110 may be protected from overvoltage events.

Figure 2A:
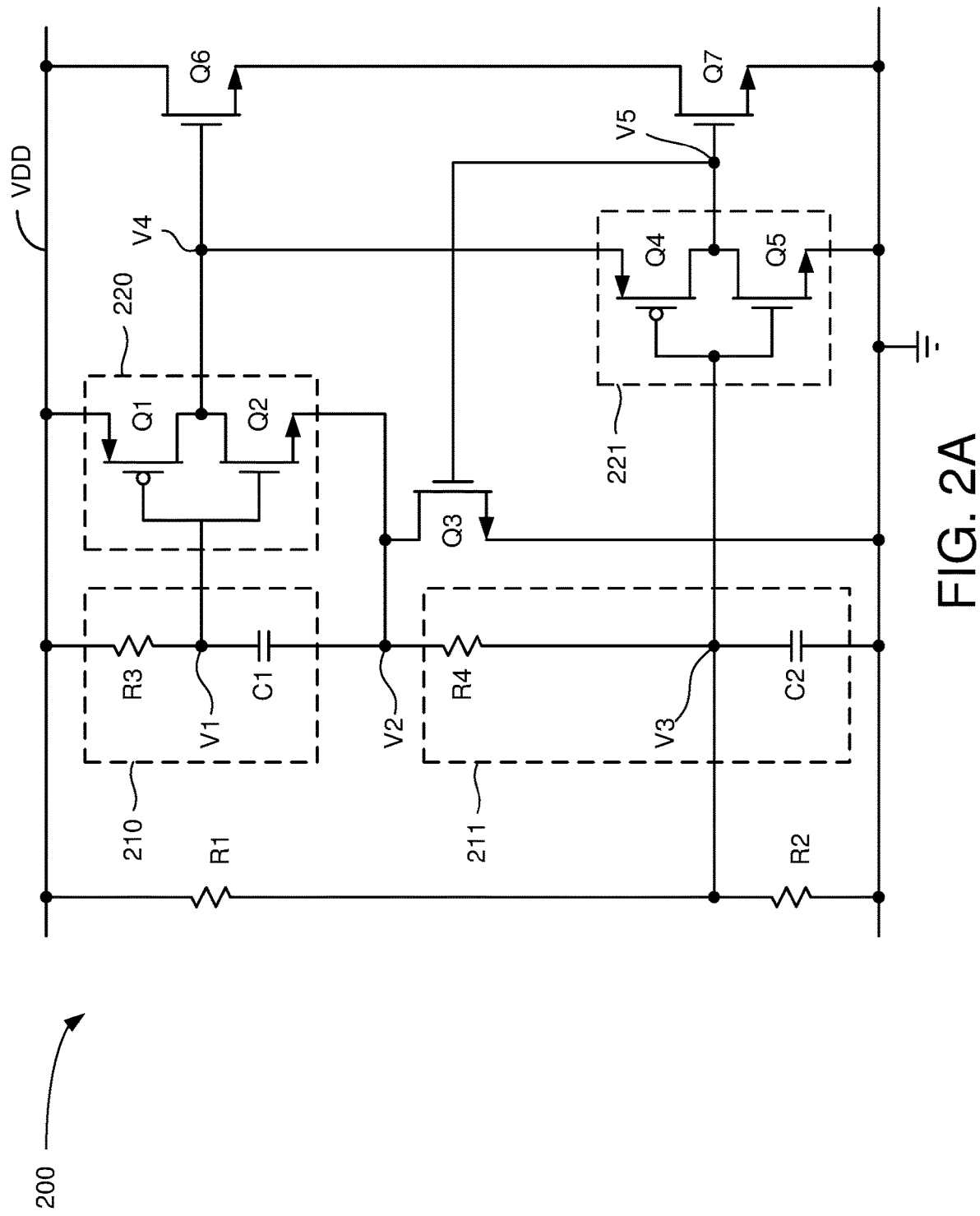
FIG. 2A shows a simplified schematic diagram of a voltage clamp, in accordance with some implementations.

FIG. 2A shows a simplified schematic diagram of a voltage clamp 200, in accordance with some implementations. The voltage clamp 200 may be an implementation of the voltage clamp 120 of FIG. 1. The voltage clamp 200 may include resistors R1-R4, capacitors C1-C2, and transistors Q1-Q7. In some implementations, the transistors Q1 and Q4 may be PMOS transistors and the transistors Q2-Q3, and Q5-Q7 may be NMOS transistors. However, in some other implementations, the transistors Q1-Q7 may be any feasible type of transistor.

The transistors Q1 and Q2 may form a first inverter 220. For example, the source of the transistor Q1 may be coupled to the power supply (depicted as VDD) and the drain of Q1 and the drain of the transistor Q2 may be coupled together at node V4. The gate of the transistor Q1 may be coupled to the gate of the transistor Q2 at node V1. The source of the transistor Q2 may be coupled to node V2. In some aspects, the first inverter 220 may draw power through the transistor Q1 from the power supply and return power through node V2 via the transistor Q2.

The transistors Q4 and Q5 may be arranged to form a second inverter 221. For example, the source of the transistor Q4 may be coupled to the node V4 (e.g., the output of the first inverter 220). The drain of the transistor Q4 and the drain of the transistor Q5 may be coupled together at node V5. The source of the transistor Q5 may be coupled to ground. The gate of the transistor Q4 and the gate of the transistor Q5 may be coupled together at node V3. In some aspects, the second inverter 221 may draw power through the transistor Q4 from the output of the first inverter 220 and return power to ground via the transistor Q5.

The resistors R1 and R2 may form a voltage divider. A first terminal of the resistor R1 may be coupled to the power supply and a second terminal of the resistor R1 may be coupled to a first terminal of the resistor R2 at node V3. A second terminal of the resistor R2 may be coupled to ground. In this manner, an output of the voltage divider is coupled to the input of the second inverter 221

The resistor R3 and the capacitor C1 may form a first resistor-capacitor (RC) network 210. A first terminal of the resistor R3 may be coupled to the power supply and a second terminal of the resistor R3 may be coupled to a first terminal of the capacitor C1 at node V1 (e.g., the input of the first inverter 220). The second terminal of the capacitor C1 may be coupled to node V2. In some implementations, the first RC network 210 may provide a filtered input signal to the first inverter 220 based on the power supply voltage and the voltage at node V2.

The resistor R4 and the capacitor C2 may form a second RC network 211. A first terminal of the resistor R4 may be coupled to node V2 and a second terminal of the resistor R4 may be coupled to a first terminal of the capacitor C2 at node V3 (e.g., the input of the second inverter 221). The second terminal of the capacitor C2 may be coupled to ground. In addition, the second terminal of the resistor R4 may be coupled to the first terminal of the resistor R2. In some implementations, the second RC network 211 may provide a filtered input signal to the second inverter 221 based on the voltage divider output of the resistors R1 and R2. Thus, the second RC network 211 may filter the output of the voltage divider based on the voltage at the node V2 and ground.

The transistors Q6 and Q7 may be "stacked" and operate as clamping transistors. That is, the transistors Q6 and Q7 may form a discharge path to dissipate energy from the supply VDD to ground. The drain of the transistor Q6 may be coupled to the power supply and the source of the transistor Q6 may be coupled to the drain of the transistor Q7. The source of the transistor Q7 may be coupled to ground. The gate of the transistor Q6 may be coupled to the output of the first inverter 220 (e.g., node V4). The gate of the transistor Q7 may be coupled to the output of the second inverter INV2 (e.g., node V5). Thus, the first inverter INV1 may generate a gate signal for transistor Q6 and the second inverter INV2 may generate a gate signal for transistor Q7.

The transistor Q3 may provide, at least in part, a feedback path from the transistor Q7 to the first inverter INV1. The gate of the transistor Q3 may be coupled to the output of the second inverter INV2 and the gate of the transistor Q7 (e.g., node V5). The source of the transistor Q3 may be coupled to ground and the drain of the transistor Q3 may be coupled to node V2. Thus, in some aspects, the transistor Q3 may provide a path to ground for the first inverter 220.

As indicated above, the transistor Q6 and the transistor Q7 operate as clamping transistors to limit a voltage difference between the power supply and ground. In one mode of operation, the power supply and ground may be floating and at a common voltage, such as near a ground potential. For example, the device 100 may be powered down or uninstalled on a printed circuit board. A high voltage ESD event may cause the voltage on the power supply to increase. The capacitor C2 causes the voltage at node V3 to initially remain near ground. In addition, the voltage at node V3 may be provided, at least in part, by the voltage divider formed by resistors R1 and R2 and/or the second RC network RC2. The voltage at node V3 is inverted by the second inverter 221, causing the transistor Q7 to turn on and conduct current between its drain and source.

Further, the first RC network RC1 and the second RC network RC2 may cause the voltage at node V2 to be a low voltage level, for example between 1-3 volts. As the ESD event causes the voltage of the power supply to increase, node V2 may operate as a virtual ground for the first inverter INV1. The voltage at node V2 may cause the voltage at node V4 (through the first inverter INV1) to be within a threshold voltage (Vt) of the power supply, causing the transistor Q6 to conduct current between its drain and source. Thus, the transistors Q6 and Q7 form a current dissipation path between the power supply and ground to protect any electronic circuit that may be coupled to the voltage clamp 200.

In some implementations, the transistor Q3 may provide (e.g., assert) a positive feedback signal, from the second inverter 221 to the first inverter 220. For example, as a gate voltage of transistor Q7 increases in magnitude (as driven by the second inverter 221), transistor Q7 conducts and provides a current path between its drain and source to limit a voltage between the power supply and ground. The gate voltage of transistor Q7 also causes transistor Q3 to increase current flow between its drain and source. Transistor Q3 thereby drives the input to the first inverter 220 (at node V1) toward ground through the first RC network 210. In turn, the first inverter 220 drives its output high, thereby increasing current flow in transistor Q6 reinforcing the operation of transistor Q7. Thus, as current flows through transistor Q7, more current is induced to flow through transistor Q6. In some implementations, the positive feedback signal may reduce operation time (turn-on time) of transistors Q6 and Q7 allowing the voltage clamp 200 to respond within short duration times associated with ESD events The transistors Q1-Q7 may have features and characteristics shared with transistors used in the electronic circuits 110 of FIG. 1. That is, the transistors Q1-Q7 may share similar feature sizes, breakdown voltages, threshold voltages, and the like with other transistors in the device 100. Thus, special "high voltage" transistors are not required in the voltage clamp 200. Using and/or limiting the transistors used in the voltage clamp 200 to the same transistors used in the electronic circuits 110 may reduce fabrication costs.

Furthermore, the voltage clamp 200 is self-biasing through the arrangement of the resistors R1-R4, the capacitors C1-C2, and the transistors Q1-Q7. Additional bias supplies or biasing circuits are not required, simplifying circuit design and area requirements.

Among other advantages, the voltage clamp 200 may respond quickly to ESD events. In some aspects, tuning the time constants of the first RC network 210 and the second RC network 211 may allow the designer to control response time of the voltage clamp 200. In some implementations, the voltage clamp 200 may operate within typical ESD time periods of one or two nano-seconds.

Figure 2B:
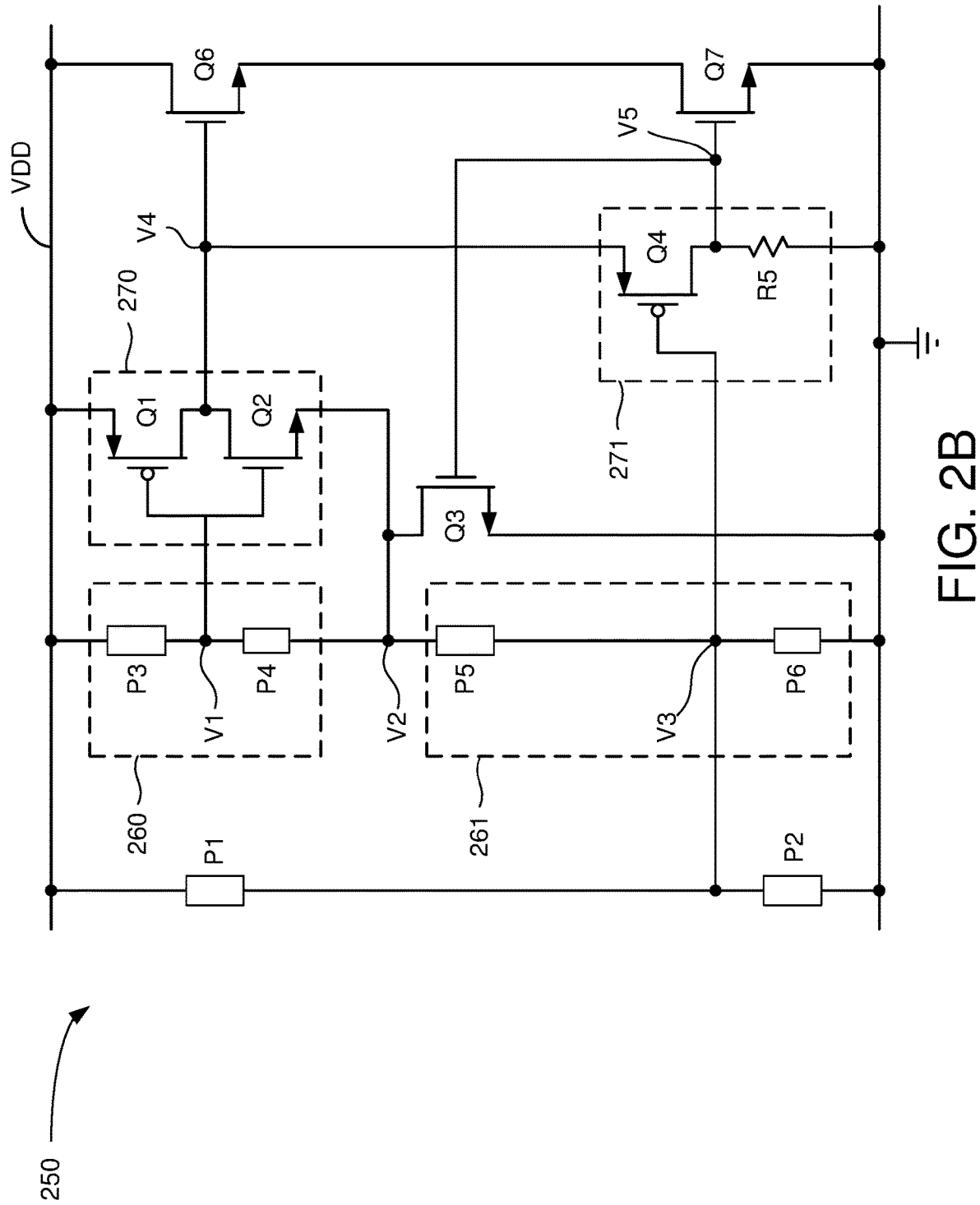
FIG. 2B shows a simplified schematic diagram of another voltage clamp, in accordance with some implementations.

FIG. 2B shows a simplified schematic diagram of a voltage clamp 250, in accordance with some implementations. The voltage clamp 250 may be another implementation of the voltage clamp 120 of FIG. 1 and similar to the voltage clamp 200 of FIG. 2A. For example, the voltage clamp 250 may include the transistors Q1-Q4 and Q6-Q7 as described with respect to the voltage clamp 200. The voltage clamp 250 may also include impedance components P1-P6 in place of resistors R1-R4 and capacitors C1-C2 of voltage clamp 200 and a resistor R5 in place of transistor Q5. The transistors Q1 and Q2 may form a first inverter 270, similar to the first inverter 220 of the voltage clamp 200. Further, a first RC network 260 may include impedance components P3 and P4 and a second RC network 261 may include impedance components P5 and P6. A second inverter 271 may include the transistor Q4 and the resistor R5. In this manner, the voltage clamp 250 may be a more general implementation of the voltage clamp 200.

The resistor R5 may be configured to enable the second inverter 271 to perform similarly to the second inverter 221 of the voltage clamp 200. That is, the resistance of resistor R5 may enable the second inverter 271 to drive the gate of transistor Q7 based on an output signal from the second RC network 261. In some implementations, the resistor divider formed by the resistors R1 and R2 of the voltage clamp 200 may be replaced with components P1 and P2, respectively, in the voltage clamp 250. The components P1 and P2 may be any feasible components (transistors, inductors, diodes, and the like) configured to provide the functionality of the resistors R1 and R2. Similarly, components used to implement the first RC network 260 and the second RC network 261 may be implemented with components other than those described with respect to the voltage clamp 200. For example, the resistor R3 and the capacitor C1 of the first RC network 210 of FIG. 2A may be replaced with components P3 and P4, respectively in the first RC network 260. The components P3 and P4 may be any feasible components that are configured to provide the functionality of the resistor R3 and the capacitor C1 of the voltage clamp 200. The resistor R4 and the capacitor C2 of the second RC network 211 of FIG. 2A may be replaced with components P5 and P6, respectively in the second RC network 261. The components P5 and P6 may be any feasible components that are configured to provide the functionality of the resistor R4 and the capacitor C2 of the voltage clamp 200. The generic components P1-P6 in the voltage clamp 250 may provide implementation flexibility by allowing the designer to select any feasible component to provide the functionality of the resistors R1-R4 and capacitors C1-C2 of the voltage clamp 200.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In the foregoing specification, the exemplary embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A voltage clamp, comprising:
   a first transistor having a drain coupled to a power supply;
   a second transistor having a drain coupled to a source of the first transistor and a source coupled to ground;
   a third transistor configured to produce a positive feedback signal based on a first voltage at a gate of the second transistor;
   a first inverter configured to control an operation of the first transistor based at least in part on the positive feedback signal so that the first transistor and the second transistor provide a discharge path between the power supply and ground;
   a second inverter configured to produce the first voltage at the gate of the second transistor;
   a voltage divider coupled between the power supply and ground and configured to provide a voltage divider output signal to an input of the second inverter; and
   a first resistor-capacitor (RC) network coupled between the voltage divider and the second inverter, the first RC network being configured to filter the voltage divider output signal provided to the input of the second inverter.

2. The voltage clamp of claim 1, wherein an output of the first inverter is couple to a gate of the first transistor.

3. The voltage clamp of claim 1, wherein the first inverter is configured to increase current through the source and drain of the first transistor based on a magnitude of the positive feedback signal.

4. The voltage clamp of claim 1, wherein a gate of the third transistor is coupled to the gate of the second transistor and a drain of the third transistor is coupled to an input of the first inverter, the positive feedback signal being provided to the input of the first inverter via the drain of the third transistor.

5. The voltage clamp of claim 1, further comprising a second RC network configured to provide a filtered input signal to the input of the first inverter based on a voltage difference between the power supply and the positive feedback signal.

6. The voltage clamp of claim 1, wherein the first RC network is configured to filter the voltage divider output signal based on the positive feedback signal.

7. The voltage clamp of claim 1, wherein the first, second, and third transistors are NMOS transistors and the first inverter is a CMOS inverter.

8. An integrated circuit comprising:
   electronic circuitry; and
   a voltage clamp comprising:
     a first transistor having a drain coupled to a power supply;
     a second transistor having a drain coupled to a source of the first transistor and a source coupled to ground;
     a third transistor configured to produce a positive feedback signal based on a first voltage at a gate of the second transistor;
     a first inverter configured to control an operation of the first transistor based at least in part on the positive feedback signal so that the first transistor and the second transistor provide a discharge path between the power supply and ground;
     a second inverter configured to produce the first voltage at the gate of the second transistor;
     a voltage divider coupled between the power supply and ground and configured to provide a voltage divider output signal to an input of the second inverter; and
     a first resistor-capacitor (RC) network coupled between the voltage divider and the second inverter, the first RC network being configured to filter the voltage divider output signal provided to the input of the second inverter.

9. The integrated circuit of claim 8, wherein the first inverter is configured to increase current through the source and drain of the first transistor responsive to a magnitude of the positive feedback signal.

10. The integrated circuit of claim 8, wherein a gate of the third transistor is coupled to the gate of the second transistor and a drain of the third transistor is coupled to an input of the first inverter, the positive feedback signal being provided to the input of the first inverter via the drain of the third transistor.

11. The integrated circuit of claim 8, wherein the voltage clamp further comprises a second RC network configured to provide a filtered input signal to the input of the first inverter based on a voltage difference between the power supply and the positive feedback signal.

12. The integrated circuit of claim 8, wherein the first RC network is configured to filter the voltage divider output signal based on the positive feedback signal.

13. The integrated circuit of claim 8, wherein the first, second, and third transistors are NMOS transistors and the first inverter is a CMOS inverter.

* * * * *